United States Patent [19]

Drislane

[11] Patent Number: 5,042,571

[45] Date of Patent: Aug. 27, 1991

[54] VARIABLE PERIMETER HEATER

[75] Inventor: William F. Drislane, Townsend, Mass.

[73] Assignee: Sierra Research and Technology, Inc., Westford, Mass.

[21] Appl. No.: 227,353

[22] Filed: Aug. 2, 1988

[51] Int. Cl.[5] .......................... B23K 3/04; F24H 3/04; H05B 3/02

[52] U.S. Cl. ........................................ 165/58; 165/61; 165/64; 392/379; 219/85.15; 228/20; 228/240

[58] Field of Search ............................ 165/58, 61, 64; 219/373, 382, 85.14, 85.15; 392/379; 228/240, 20, 180.1, 180.2; 156/497

[56] References Cited

U.S. PATENT DOCUMENTS

| | | | |
|---|---|---|---|
| 3,263,057 | 7/1966 | Conti | 219/85.14 |
| 3,382,564 | 5/1968 | Gallentine | 219/85.15 |
| 4,205,221 | 5/1980 | Meyer | 219/323 |
| 4,426,571 | 1/1984 | Beck | 219/373 |
| 4,552,300 | 11/1985 | Zovko et al. | 219/373 |
| 4,610,388 | 9/1986 | Koltuniak et al. | 219/373 |
| 4,626,205 | 12/1986 | Barkley et al. | 228/20 |
| 4,775,775 | 10/1988 | Spigarelli et al. | 219/382 |
| 4,847,465 | 7/1989 | Toyama et al. | 219/373 |

Primary Examiner—John Ford
Attorney, Agent, or Firm—Weingarten, Schurgin, Gagnebin & Hayes

[57] ABSTRACT

A variable parameter heater for applying heat in a predetermined profile to a work surface. The heater has a plurality of elongated members which are interconnected to form a frame. Elongated members are slidingly adjustable to provide the intended heat profile. Each elongated member contains first and second rows of apertures. Heated air is delivered to the work surface past selectively energized heating elements disposed in the first row of apertures. Cool air where required is delivered to the work surface through the second row of apertures. The heater may include a vacuum probe for depositing or removing components relative to the work surface. The vacuum probe may also direct cool air to the work surface. Mirrors may be mounted upon elongated members to provide enhanced viewing of the work surface. In case of disablement, elongated members are individually removeble for repair or replacement.

19 Claims, 2 Drawing Sheets

VARIABLE PERIMETER HEATER

FIELD OF THE INVENTION

This invention relates to electrical component and circuit board heaters and more particularly to selectively energized heaters to provide localized heating of electronic circuit boards.

BACKGROUND OF THE INVENTION

Electrical components, particularly integrated circuit devices, are commonly connected to circuit boards by soldering. I.C.'s may be leaded or leadless depending on the intended method of solder connection. Leaded I.C.'s comprise leads for insertion into corresponding sockets in the circuit board or for surface mounting on the circuit board. Leaded I.C.'s may be connected to a connector which is soldered to the circuit board. After insertion into the circuit board sockets, the ends of the I.C. leads or the I.C. connector leads protrude through the circuit board and are soldered using a solder wave process or other conventional soldering means. Surface mount I.C.'s are connected to the circuit board by solder connecting the I.C. leads to solder pads located on the surface of the circuit board. Leadless I.C.'s do not require leads for connection to the circuit board. Instead, contact pads are disposed on a surface of the leadless I.C. Corresponding solder pads aredisposed on the circuit board in a configuration to oppose the I.C. contact pads. The leadless I.C. is placed on the solder pads and heat is applied to reflow the solder or solder paste on the solder pad to achieve an electrical connection. It is often necessary to remove I.C.'s or I.C. connectors for repair or replacement. Because I.C.'s are highly heat-sensitive and fragile, heat to reflow the solder must be applied with great accuracy only to specific perimeter solder joints to avoid damaging the I.C. Moreover, due to the possibility of damage to the I.C. resulting from accidental contact between the heater and I.C., it is advantageous to provide the heater operator with a clear view of the work area to facilitate alignment of the heater and the work surface. Prior heaters, such as that disclosed in U.S. patent application Ser. No. 062,903, also address the problems associated with the application of heat in the vicinity of fragile, heat-sensitive electrical devices.

SUMMARY OF THE INVENTION

The variable perimeter heater of the present invention provides a novel and improved tool for applying heat to a work surface with great accuracy; for applying heat to a work surface in an adjustable predetermined heat profile; for placing components on and removing components from the work surface; for permitting viewing of the work surface during operation of the heater, and for facilitating repair and replacement of disabled heating elements of the heater.

Briefly, the novel and improved heater of the present invention comprises a plurality of elongated members in slidingly adjustable position to define a desired perimeter. Each elongated member comprises two pluralities of recesses having apertures linearly arrayed in two rows extending substantially the length of the wall. The recesses of the inner row of each wall contain selectively controllable heating elements which are electrically connected to a control means and also connected to a gas supply means. The recesses of the outer row of each wall are also connected to a gas supply means. The gas supply means is controllable to force a desired volume of air through the inner and outer rows of recesses and apertures and onto the work surface. Air is directed through the inner rows of recesses past the selectively energized plurality of heater elements through the apertures to the work surface to define a selected heat profile. The apertures of the outer rows direct cool air from a gas supply means to the work surface.

A vacuum probe may be used in conjunction with the heater. The vacuum probe comprises vacuum means which provides suction at the nozzle end of the vacuum probe and is movable to the work surface to engage an intended component. Means may be connected to the vacuum probe nozzle end to direct cool air from the gas supply means to the work surface.

Mirrors may be mounted on the heater to enhance the operator's view of the work surface. For example, a first mirror may be mounted on a first elongated member and angled toward the work surface. A second mirror may be mounted on a second elongated member opposite the first elongated member and is angled generally upwards. An image of the work surface is reflected from the downward facing mirror to the upward facing mirror and thence to the operator's observation position. The mirrors may be arranged to direct an image of the work surface to a camera or a microscope.

The downward facing mirror may include an orifice through which the vacuum probe is moveable to collect or deposit components. Viewing the operation of the vacuum probe is thereby further enhanced.

The electrical control means of the present invention permit individual control of the heating elements disposed within the elongated member recesses. The operator may switch individual heating elements on or off and may vary the amount of heat generated by each heater element.

The elongated members of the present invention are assembled to permit easy disassembly when repair or replacement is required. For instance, when a single heating element malfunctions, the elongated member housing that element is removed to be worked on. Disassembly or removal of the entire heater from the work surface is not required and repair or replacement is thereby facilitated.

DESCRIPTION OF THE DRAWINGS

The invention will be more fully understood from the following detailed disclosure taken in conjunction with the accompanying drawings, in which.

DETAILED DESCRIPTION OF THE INVENTION

Figure 1:
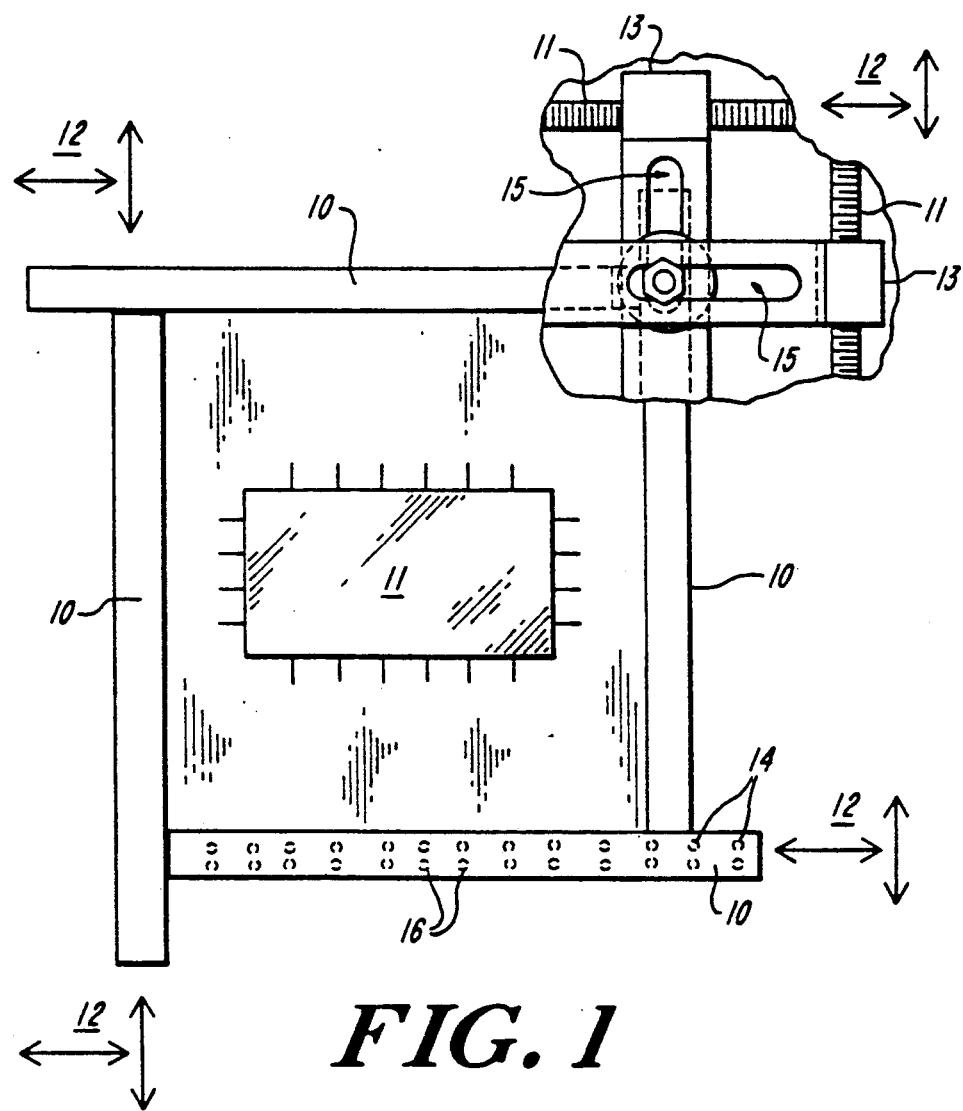
FIG. 1 is an overhead view embodiment of the heater of the present invention.

Referring to FIG. 1, an embodiment of the variable perimeter heater of the present invention is illustrated. Four elongated members 10 are interconnected in sliding engagement using conventional slideable connecting means such as lead screws 11 attached to slideable support members 13 having alongated slots 15. Respective elongated members 10 may be translated in the directions indicated by arrows 12. When elongated members 10 aretranslated in an outwardly direction, the enclosed area is enlarged. Conversely, when elongated members 10 are translated in an inwardly direction, towards an electrical component 11, the enclosed area is reduced. Each elongated member 10 contains a first plurality of recesses 14 arrayed on the inner side of elongated member 10 and a second plurality of recesses 16 arrayed on the outer side of the elongated member 10.

Figure 2:
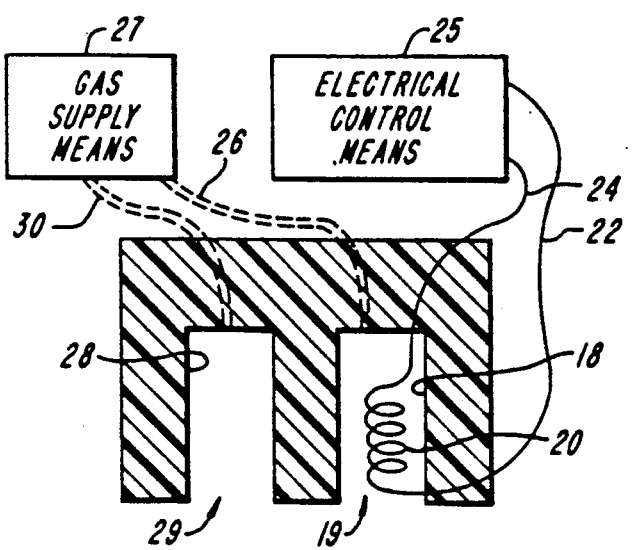
FIG. 2 is a cross-sectional view of an elongated member of the present invention.

Referring now to FIG. 2, an elongated member 10 is illustrated in cross-section. A recess 18 of the first plurality of recesses 14 and having an aperture 19 contains a heater element 20. Heater element 20 is electrically interconnected via wires 22, 24 to an electrical control means 25. Each heater element 20 of the first plurality of recesses 14 of the heater is electrically interconnected to the electrical control means 25. Electrical control means 25 provides selective energization of individual heater elements 20 to switch individual heater elements 20 on or off. In addition, the magnitude of heat emitted by each heater element may be controlled and varied. Tube 26 connects inner aperture 18 to a gas supply means 27. Gas supply means 27 is controllable to direct air via tube 26 through recess 18 past heater element 20 to the work surface 31. Consequently, when heater element 20 is energized, heated air is directed to the work surface through recess 18 and aperture 19. When heater element 20 is not energized, the air directed through recess 18is unheated, and remains at ambient temperature. Second recess 28, having an aperture 29, of FIG. 2 is a single one of second plurality of apertures 16. Recess 28 is connected to gas supply means 27 by tube 30. There is no heater element in recess 28 to heat the air directed therethrough by gas supply means 27. Air passing through tube 30 and recess 28 cools the work surface adjacent the area heated by the air directed through recess 18 past heater element 20. The air directed through tube 30 and recess 28 may be cooled to increase the cooling effect on the work surface area adjacent the area heated by air passing through recess 18.

Figure 3:
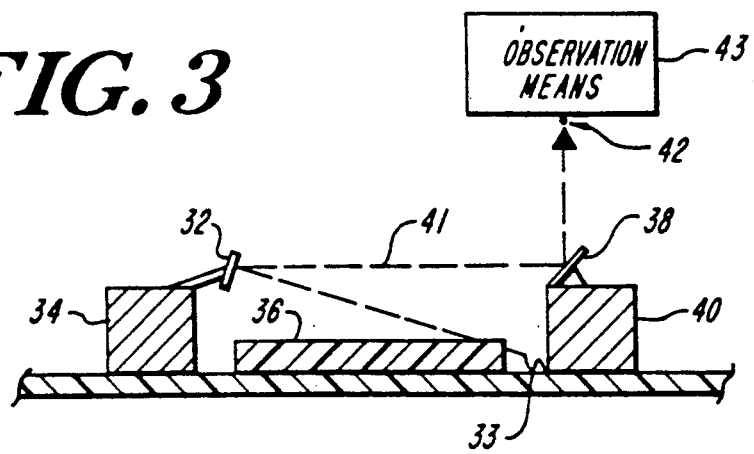
FIG. 3 is a cross-sectional view of the present invention and illustrates the view-enhancing mirrors.

Referring now to FIG. 3 a cross-section of the assembly of FIG. 1 further comprising mirrors 32, 38 is illustrated. A first mirror 32 is mounted using conventional means on a first elongated member 34. Mirror 32 is angled generally downwards towards the work surface 33. A second mirror 38 is mounted on a second elongated member 40. Second mirror 38 is angled generally upwards.

An observation point 42 located generally above the heater is also illustrated. An image of selected portions of the work area 36 is reflected, as shown by dotted line 41, by mirror 32 towards mirror 38, and from mirror 38 towards observation point 42. Observation means 43 may be disposed at observation point 42 and may comprise a camera, a microscope or other observation means known to the art. It will be appreciated that mirrors 32, 38 are adjustable to direct an image of the work surface to varying observation positions.

Figure 4A:
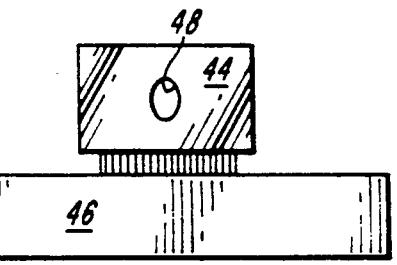
FIG. 4A is a side view of an elongated member and mirror having a vacuum probe receiving orifice.
Figure 4B:
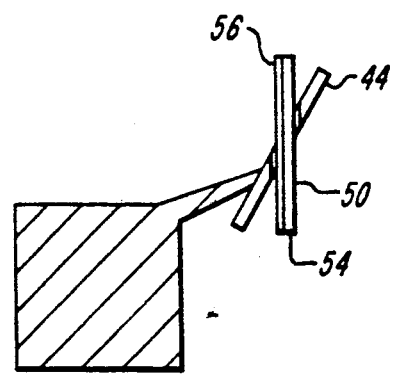
FIG. 4B is a side view of an elongated member, a mirror and a vacuum probe extending through the mirror orifice.

Referring now to FIGS. 4A and 4B, a mirror 44 mounted on an elongated member of the heater of the present invention is illustrated. Mirror 44 is mounted on elongated member 46 and has an orifice 48 through which vacuum probe 50 is moveable to engage a work piece. Mirror 44 reflects an image of selected portions of work area 36 and vacuum probe end 54 to a second mirror, such as mirror 38 in FIG. 3, to observation point 42. Thus, the vacuum probe head 54 can be accurately directed to the intended position. Air directing means 56 may be attached to vacuum probe 50 to direct air to the work surface. Air directing means 56 may direct either heated air or cooled air to the work surface 52 depending on the circumstances.

The above described invention is illustrative of a novel heater which overcomes significant disadvantages of prior heaters.

Other modifications, embodiments and departures from the present disclosure are possible without departing from the inventive concept herein. The invention is not to be limited by what has been particularly shown and described except as indicated in the appended claims.

What is claimed is:

1. A variable size perimeter heater for applying a pre-determined heat profile to a work surface comprising:
a plurality of elongated members slidably adjustably mounted with respect to adjacent elongated members to define an intended perimeter of variable size; each of the members including:
a first plurality of recesses disposed in said member and terminating in a linear array of apertures in a face of said member;
a corresponding plurality of heating elements disposed in said first plurality of recesses; and
electrical interconnection means for connecting said plurality of heating elements to an electrical control source.

2. The variable perimeter heater of claim 1 further comprising means for directing gas through said first plurality of recesses past said plurality of heating elements and through the apertures to the work surface.

3. The variable perimeter heater of claim 2 further comprising:
a second plurality of recesses disposed in said member and terminating in a linear array of apertures in said face of said member; and
means for directing gas through said second plurality of recesses and apertures to the work surface.

4. The variable perimeter heater of claim 3 wherein said second plurality of apertures is substantially parallel and exterior to said first plurality of apertures.

5. The variable perimeter heater of claim 4 including means to selectively energize said plurality of heating elements.

6. The variable perimeter heater of claim 5 further including selective energizing means operative to provide a selected magnitude of power to said plurality of heating elements.

7. The variable perimeter heater of claim 6 further comprising means for placing a work-piece on, and removing a work-piece from the work surface.

8. The variable perimeter heater of claim 7 further comprising means for viewing the work surface.

9. The variable perimeter heater of claim 8 wherein said viewing means comprises at least one mirror.

10. The variable perimeter heater of claim 9 wherein said viewing means further comprises a video camera.

11. A variable perimeter heater of claim 9 wherein said viewing means further comprises a microscope.

12. The variable perimeter heater of claim 9 wherein a one of a plurality of mirrors includes an orifice to receive said work-piece placing means.

13. The variable perimeter heater of claim 7 further comprising means connected to said work-piece placing means for directing air to the work surface.

14. A variable perimeter heater for applying a predetermined heat profile to a work surface comprising:
- a plurality of elongated members slidably adjustably mounted with respect to adjacent elongated members to define an intended perimeter of variable size;
- a first plurality of recesses having apertures arrayed in the work surface opposing face of said plurality of elongated members;
- a corresponding plurality of heating elements disposed in said first plurality of recesses;
- means to electrically interconnect each of said plurality of heating elements to an electrical control source;
- means to selectively energize said plurality of heating elements to provide an intended magnitude of heat;
- means to direct gas past said plurality of heating elements to the work surface;
- a second plurality of recesses substantially linearly arrayed in the work surface opposing face of said plurality of elongated members substantially parallel and exterior to said first plurality of recesses; and
- means to direct gas through said second plurality of recesses to the work surface.

15. The variable perimeter heater of claim 14 further comprising means for placing a work-piece on, and removing a work-piece from, the work surface.

16. The variable perimeter heater of claim 15 further comprising viewing means to observe the work surface.

17. The variable perimeter heater of claim 16 wherein said viewing means comprises at least one mirror.

18. The variable perimeter heater of claim 16 further comprising means connected to said work-piece placing means to direct air to the work surface.

19. The variable perimeter heater of claim 17 wherein said at least one mirror further includes an orifice to receive said work-piece placing means.

* * * * *

UNITED STATES PATENT AND TRADEMARK OFFICE
CERTIFICATE OF CORRECTION

PATENT NO. : 5,042,571
DATED : August 27, 1991
INVENTOR(S) : William F. Drislane It is certified that error appears in the above-indentified patent and that said Letters Patent is hereby corrected as shown below:

Column 4, line 27, "size; each" should read --size, each--.

Column 4, line 31 -35, "elements disposed in said first plurality of recesses; and" should read --elements, one of said heating elements disposed in each of said first plurality of recesses; and--.

Column 5, line 8, "work surface comprising:" should read --work surface, comprising:--.

Column 5, line 17-18, "elements disposed in said first plurality of recesses;" should read --elements, one of said heating elements disposed in each of said first plurality of recesses;--.

Signed and Sealed this

Ninth Day of November, 1993

Attest:

BRUCE LEHMAN

*Attesting Officer*      Commissioner of Patents and Trademarks